(12) United States Patent
Van Nieuwenhuysen et al.

(10) Patent No.: US 9,087,957 B2
(45) Date of Patent: Jul. 21, 2015

(54) METHOD FOR PRODUCING AN EMITTER STRUCTURE AND EMITTER STRUCTURES RESULTING THEREFROM

(75) Inventors: Kris Van Nieuwenhuysen, Meensel Kiezegem (BE); Filip Duerinckx, Kessel-lo (BE)

(73) Assignee: IMEC, Leuven (BE)

( * ) Notice: Subject to any disclaimer, the term of this patent is extended or adjusted under 35 U.S.C. 154(b) by 961 days.

(21) Appl. No.: 12/608,761

(22) Filed: Oct. 29, 2009

(65) Prior Publication Data
US 2010/0139763 A1 Jun. 10, 2010

Related U.S. Application Data

(63) Continuation of application No. PCT/EP2008/059463, filed on Jul. 18, 2008.

(60) Provisional application No. 60/950,531, filed on Jul. 18, 2007.

(51) Int. Cl.
*H01L 31/18* (2006.01)
*H01L 31/0236* (2006.01)
*H01L 31/068* (2012.01)

(52) U.S. Cl.
CPC ...... *H01L 31/1804* (2013.01); *H01L 31/02363* (2013.01); *H01L 31/068* (2013.01); *H01L 31/1868* (2013.01); *Y02E 10/547* (2013.01)

(58) Field of Classification Search
CPC ............... H01L 29/66287; H01L 29/66303; H01L 29/7375
See application file for complete search history.

(56) References Cited

U.S. PATENT DOCUMENTS

| 4,922,218 A | 5/1990 | Watanabe et al. |
| 5,217,539 A * | 6/1993 | Fraas et al. .................... 136/246 |
| 5,378,289 A | 1/1995 | Noguchi et al. |
| 6,147,297 A * | 11/2000 | Wettling et al. ............... 136/256 |
| 6,552,414 B1 | 4/2003 | Horzel et al. |
| 2006/0209915 A1* | 9/2006 | Shima ......................... 372/46.01 |
| 2008/0308156 A1* | 12/2008 | Boyer, Jr. ..................... 136/262 |

OTHER PUBLICATIONS

Stefan Janz, Amorphous Silicon Carbide for PV applications, Dissertation, 2006.*
International Search Report dated Mar. 24, 2009 for PCT/EP2008/059463.
Written Opinion of ISA dated Mar. 24, 2009 for PCT/EP2008/059463.

(Continued)

*Primary Examiner* — Shannon Gardner
(74) *Attorney, Agent, or Firm* — Knobbe, Martens, Olson & Bear LLP (57) ABSTRACT

A method for forming an emitter structure on a substrate and emitter structures resulting therefrom is disclosed. In one aspect, a method includes forming, on the substrate, a first layer comprising semiconductor material. The method also includes texturing a surface of the first layer, thereby forming a first emitter region from the first layer, wherein the first emitter region has a first textured surface. The method also includes forming a second emitter region at the first textured surface, the second emitter region having a second textured surface.

10 Claims, 4 Drawing Sheets

(56) References Cited

OTHER PUBLICATIONS

Schmich et al., Emitter epitaxy for crystalline silicon thin-film solar cells, 21$^{st}$ European Photovoltaic Solar Energy Conference, Sep. 4-8, 2006, Dresden, Germany, pp. 734-737.

Sharma et al., Outlook for high efficiency solar cells to be used with and without concentration, Energy Conversion and Management, vol. 36, No. 4, pp. 239-255, 1995 Elsevier Science.

* cited by examiner

METHOD FOR PRODUCING AN EMITTER STRUCTURE AND EMITTER STRUCTURES RESULTING THEREFROM

CROSS REFERENCE TO RELATED APPLICATIONS

This application is a continuation of PCT Application No. PCT/EP2008/059463, filed on Jul. 18, 2008, which claims priority under 35 U.S.C. §119(e) to U.S. provisional patent application 60/950,531 filed on Jul. 18, 2007. Each of the above applications is incorporated by reference hereby in its entirety.

BACKGROUND OF THE INVENTION

1. Field of the Invention

The present invention relates to a method for forming an emitter structure, for example an emitter of a photovoltaic device, and to emitter structures resulting therefrom, as well as to devices comprising such emitter structures.

2. Description of the Related Technology

The emitter of crystalline silicon solar cells is in most cases formed by means of a diffusion process. For example, in case of bulk crystalline silicon solar cells made on p-type silicon wafers, an n-type dopant (such as e.g. P) is diffused into the wafer, wherein the n-type dopant overcompensates the p-type dopant (e.g. B or Ga) of the silicon wafer such that a p-n junction is formed. The emitter diffusion process is usually performed at the front surface of the photovoltaic cell, after texturing of the front surface (the front surface being the face of the photovoltaic cell that is intended for receiving illumination). The main aim of this texturing is to decrease the reflection of light at the front surface. The emitter diffusion process results typically in a Gaussian distribution profile of the n-type dopant, with a high dopant concentration (e.g. $\sim 10^{20}$ cm$^{-3}$) at the front surface. This high surface concentration is needed to achieve a good contact resistance for the front side metal grid, especially when the metal grid is formed by means of an industrial screen printing process. However, the high surface concentration also results in a poor short-wavelength response due to heavy doping effects and increased recombination in the emitter region.

In order to improve the short-wavelength response, a selective emitter structure can be used (as e.g. described in U.S. Pat. No. 6,552,414), wherein a highly doped emitter region is provided underneath the metal grid and wherein a lightly doped emitter region is provided between the metal contacts of the grid, the lightly doped emitter region resulting in a lower surface recombination and an enhanced blue response as compared to a highly doped emitter. However, selective emitter structures require additional processing steps that may include lithography, which is not industrially applicable for large scale production of solar cells. Moreover, misalignment of the metal grid with respect to the highly doped emitter region of the selective emitter structure can lead to junction leakage resulting from metal penetration through the junction, and to a reduction in open-circuit voltage as a result of this leakage.

As an alternative for forming the emitter of a photovoltaic cell by diffusion, it is also possible to grow the emitter on top of the substrate, for example by chemical vapor deposition (CVD), as for example described for epitaxial cells by Schmich et al. in "Emitter Epitaxy for Crystalline Silicon Thin-Film Solar Cells", Proceedings of the 21$^{st}$ European Photovoltaic Solar Energy Conference and Exhibition, Dresden, 2006, page 734. The formation of a CVD-grown emitter is realized on a non-textured surface. Therefore, losses by reflection at the front surface are relatively high.

SUMMARY OF CERTAIN INVENTIVE ASPECTS

Certain inventive aspects relate to a method for producing an emitter structure, which alleviates or avoids the problems of the prior art, and to an emitter structure and a photovoltaic cell comprising such emitter structure.

In one aspect, the present invention provides a method for forming an emitter structure on a substrate. The method comprises forming, on the substrate, a first layer comprising semiconductor material; texturing a surface of the first layer, thereby forming a first emitter region from the first layer, the first emitter region having a first textured surface; and forming a second emitter region at the first textured surface, the second emitter region having a second textured surface.

In embodiments according to the present invention, forming the first layer may comprise epitaxially growing the first layer on a surface of the substrate.

In embodiments according to the present invention, texturing a surface of the first layer may comprise plasma etching the first layer.

In embodiments according to the present invention, forming the second emitter region may comprise growing the second emitter region on the first textured surface. Growing the second emitter region may comprise epitaxially growing the second emitter region.

In certain embodiments according to the present invention, forming the second emitter region may comprise forming the second emitter region in an upper part of the first emitter region. Forming the second emitter region may comprise forming the second emitter region by means of dopant introduction, e.g. by means of diffusion, implantation or laser doping.

Embodiments of the present invention thus provide a method for forming a double emitter structure with intermediate texturing, wherein at least part of the emitter structure may be epitaxially grown on a substrate. The method for forming the double emitter structure comprises forming, on a substrate, a thick and moderately doped first emitter region, for example with a thickness in the range between about 0.2 µm and 10 µm, and a doping concentration in the range between about $10^{15}$ cm$^{-3}$ and $10^{19}$ cm$^{-3}$, with a textured surface, and forming a thin and highly doped second emitter region, for example with a thickness between about 5 nm and 1 µm and a doping concentration in the range between about $5 \times 10^{18}$ cm$^{-3}$ and $10^{22}$ cm$^{-3}$, at the textured surface of the first emitter region.

In another aspect, the present invention provides an emitter structure comprising a first emitter region and a second emitter region adjacent to the first emitter region, there being an interface between the first emitter region and the second emitter region. The interface between the first emitter region and the second emitter region is a textured interface. The textured interface between the first emitter region and the second emitter region provides a good fill factor and good short circuit currents in photovoltaic cells built using such emitter structure according to embodiments of the present invention.

In an emitter structure according to embodiments of the present invention, the average thickness of the first emitter region may be between about 0.2 µm and 10 µm. In an emitter structure according to embodiments of the present invention, the first emitter region may have a doping concentration between about $10^{15}$ cm$^{-3}$ and $10^{19}$ cm$^{-3}$. In embodiments of the present invention, the first emitter region may have a constant doping concentration over its thickness. In some embodiments of the present invention, the first emitter region may have a non-constant doping concentration over its thickness, for example it may have a gradually changing dopant concentration over its thickness, in particular it may for example have a dopant concentration which is higher at the level of the interface between the first emitter region and the second emitter region than at other levels of the first emitter region.

In an emitter structure according to embodiments of the present invention, the average thickness of the second emitter region may be lower than the average thickness of the first emitter region. In embodiments of the present invention, the thickness of the second emitter region may be between about 5 nm and 1 µm. In embodiments of the present invention, the second emitter region may have a doping concentration which is higher than the doping concentration of the first emitter region. In embodiments of the present invention, the second emitter region may have a doping concentration between about $5\times10^{18}$ cm$^{-3}$ and $10^{22}$ cm$^{-3}$. In embodiments of the present invention, the second emitter region may have a constant doping concentration over its thickness. In embodiments of the present invention, the second emitter region may have a non-constant doping concentration over its thickness, for example it may have a gradually changing dopant concentration over its thickness, in particular it may for example have a dopant concentration which is lower at the level of the interface between the first emitter region and the second emitter region than at other levels of the second emitter region. In embodiments of the present invention, the doping concentration of the second emitter region at the interface may be at least a factor of about 10 higher than the doping concentration of the first emitter region at the interface. It is an advantage of an emitter structure according to embodiments of the present invention that the difference in doping concentration between the first emitter region and the second emitter region may result in the formation of a front surface field (FSF) having a surface passivating effect.

In yet another aspect the present invention provides a photovoltaic device comprising a base region and an emitter structure according to any emitter structure embodiments of the present invention. Such photovoltaic device according to embodiments of the present invention may further comprise a non-intentionally doped layer in between the base region and the emitter structure.

Embodiments of the invention further provide an emitter structure formed by the above method and a photovoltaic cell comprising such emitter structure. The double emitter structure of embodiments of the present invention comprises a first emitter region that is relatively thick, for example with a thickness in the range between about 0.2 µm and 10 µm, and moderately doped, for example with a doping concentration in the range between about $10^{15}$ cm$^{-3}$ and $10^{19}$ cm$^{-3}$, and, adjacent to the first emitter region, a second emitter region that is thin, for example with a thickness between about 5 nm and 1 µm, and highly doped, for example with a doping concentration in the range between about $5\times10^{18}$ cm$^{-3}$ and $10^{22}$ cm$^{-3}$. The interface between the first emitter region and the second emitter region is a textured interface. When used in a photovoltaic device, the emitter structure in accordance with embodiments of the present invention may result in a good short-wavelength response because of the moderate doping concentration of the first emitter region and a good front contact resistance because of the high doping concentration of the second emitter region. It is an advantage of embodiments of the present invention that the need for aligning the front surface metal grid of a photovoltaic device to a heavily doped region, e.g. for avoiding junction leakage, is avoided. A photovoltaic cell comprising an emitter structure according to embodiments of the present invention may be less sensitive to leakage resulting from metal penetration through the junction as compared to prior art devices, because the emitter structure is relatively thick, e.g. having a thickness between about 205 nm and 11 µm, and thus the junction is relatively deep. Losses by reflection at the front surface of the photovoltaic cell may be reduced by providing a textured surface.

DETAILED DESCRIPTION OF CERTAIN ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes.

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

For the purpose of the present description, within the context of photovoltaic cells, texturing is done to (substantially) reduce light reflection at the front surface of a cell, so it is related to roughness at a macro-scale, with feature sizes, for example of about 100 nm or more, e.g. at least about 500 nm.

For the purpose of the present description, an emitter structure is defined as a thin (with a thickness up to about 12 µm, e.g. between about 0.2 and 10 µm, for example between about 2 and 10 µm, for example between about 5 and 10 µm) semiconductor layer at the surface of a device, e.g. photovoltaic device, this emitter structure being doped with dopants of a first dopant type, a thicker underlying base of the device being doped with dopants of a second dopant type having an opposite polarity with respect to the first dopant type. For example, in embodiments of the present invention, the emitter structure may be doped with donor atoms resulting in an opposite polarity compared to the thicker underlying base of the device being doped with acceptor atoms. In alternative embodiments, the emitter structure may be doped with acceptor atoms resulting in an opposite polarity compared to the thicker underlying base of the device being doped with donor atoms. In combination with the base, the emitter structure forms the pn-junction or the np-junction of the device, e.g. photovoltaic device.

Certain embodiments relate to an emitter structure that is applied at the front surface of a photovoltaic device. The front surface, as opposed to the back surface, of a photovoltaic device is the surface adapted for being oriented towards a light source and thus for receiving illumination. However, other configurations are also possible. For example, in embodiments of the present invention, an emitter structure may be applied at the back surface of a photovoltaic device. In yet alternative embodiments, an emitter structure may be provided both at the front surface and at the back surface of a photovoltaic device.

In the further description, an average thickness is used for indicating the thickness of the first emitter region and the second emitter region. The thickness of these regions is generally not uniform, because they have textured surfaces. In the experiments performed, the average thickness of the first emitter region was calculated based on weighing the samples. The average thickness of a second emitter region grown on top of a first emitter region was determined by measuring the thickness of a layer grown on a flat surface with the same growth conditions as used for growing the second emitter region.

Certain embodiments relate to a method for forming an emitter structure and to an emitter structure thus obtained, as well as to a photovoltaic device comprising such an emitter structure.

In one embodiment, an emitter structure 5 comprises a first emitter region 11 and a second emitter region 12 adjacent to the first emitter region 11. An interface 14 between the adjoining first emitter region 11 and second emitter region 12 is a textured interface 14.

Figure 1:
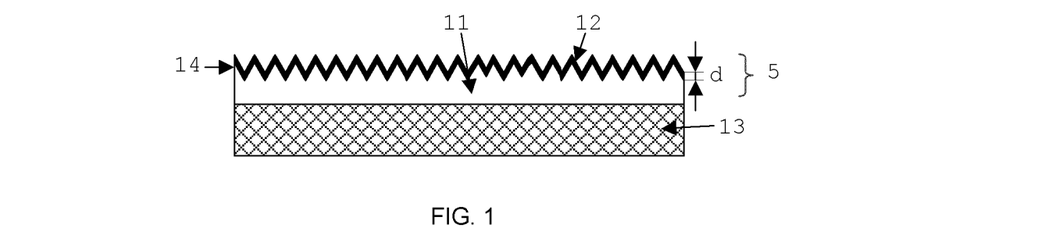
FIG. 1 shows an emitter structure according to embodiments of the present invention and illustrates the depth d of the interface between the second emitter region and the first emitter region.

An emitter structure 5 according to embodiments of the present invention comprises two parts or regions adjacent to each other and adjoining each other, more in particular a first emitter region 11 and a second emitter region 12, as for example illustrated in FIG. 1. The first emitter region 11 may be a moderately doped, relatively thick layer or stack of layers. In embodiments of the present invention, the doping concentration of the first emitter region 11 may be in the range between about $10^{15}$ cm$^{-3}$ and $10^{19}$ cm$^{-3}$. The average thickness of the first emitter region may for example be in the range between about 0.2 µm and 10 µm or between about 0.2 µm and 7 µm or between about 0.2 µm and 4 µm. The second emitter region 12 may be a highly-doped, thin layer or stack of layers. The doping concentration of the second emitter region 12 may be higher than the doping concentration of the first emitter region 11. The doping concentration of the second emitter region 12 may be in the range between about $5 \times 10^{18}$ cm$^{-3}$ and $10^{22}$ cm$^{-3}$. The thickness of the second emitter region 12 may be smaller than the thickness of the first emitter region 11. The second emitter region 12 may have an average thickness larger than about 5 nm and smaller than about 1 µm, smaller than 500 nm, smaller than 250 nm, smaller than 200 nm, smaller than 150 nm, smaller than 100 nm, smaller than 50 nm, smaller than 40 nm, or smaller than 25 nm.

The emitter structure according to embodiments of the present invention can be used as an emitter of a photovoltaic device. In this case the second emitter region 12 is located closest to the front surface of the photovoltaic device and the first emitter region 11 is located in between the second emitter region 12 and a base region 13 of the photovoltaic device. The highly doped second emitter region 12 ensures a good electrical contact with the metallization at the front surface of the photovoltaic cell. In addition, the strong difference in doping concentration at the interface 14 between the first emitter region 11 and the second emitter region 12 creates a strong and beneficial electric field. In embodiments of the present invention, the interface 14 between the first emitter region 11 and the second emitter region 12 may be a textured interface.

In one embodiment, a method for forming an emitter structure 5 on a substrate 10 is disclosed. The method comprises forming a first layer 20 comprising a semiconductor material on the substrate 10; texturing a surface of the first layer 20, thereby forming a first emitter region 11 from the first layer 20, the first emitter region 11 having a first textured surface 21; and forming a second emitter region 12 at the first textured surface 21, the second emitter region 12 having a second textured surface 22.

Figure 2:
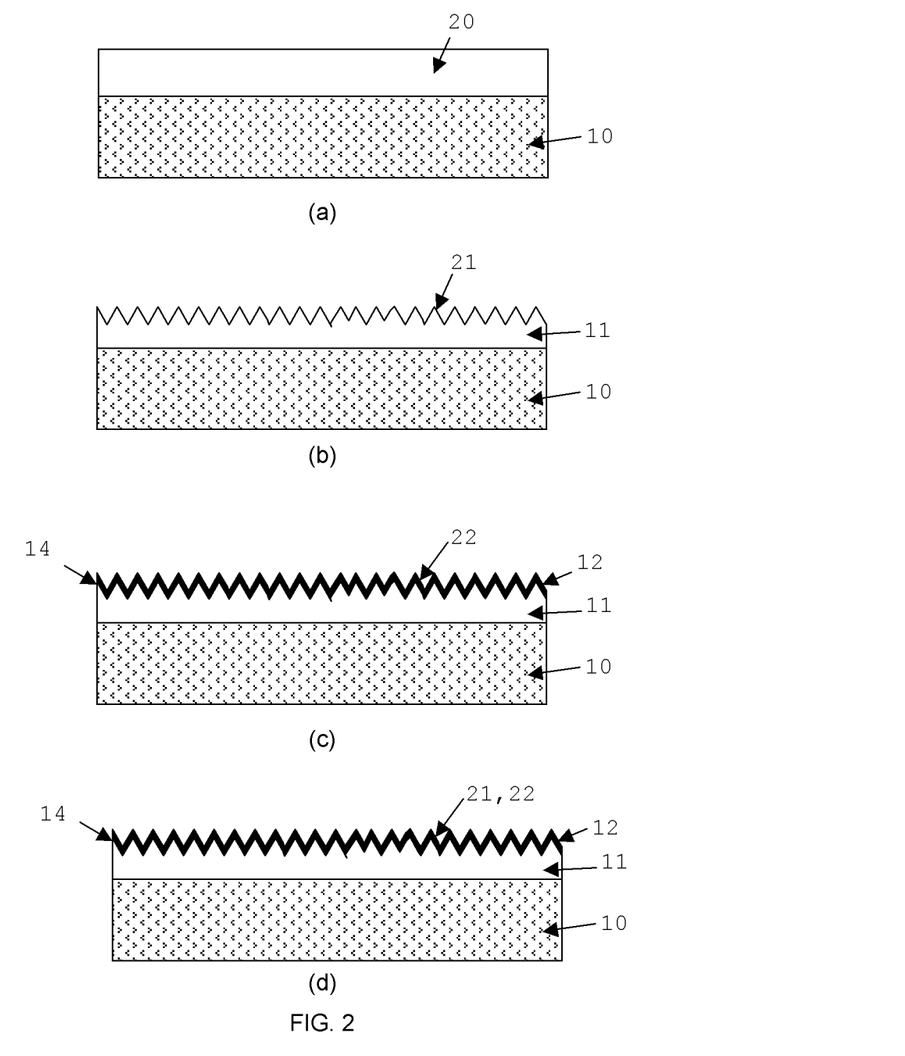
FIG. 2 illustrates a process for forming an emitter structure according to embodiments of the present invention.

A method for forming an emitter structure 5 according to an embodiment of the present invention on a substrate 10 is illustrated in FIG. 2. One embodiment is further described for substrates 10 comprising silicon. However, any other suitable substrate known by a person skilled in the art, such as for example substrates comprising semiconductor materials other than silicon, high temperature glass substrates or ceramic substrates may be used. One embodiment is further described for emitter structures 5 comprising silicon, but other semiconductor materials known by a person skilled in the art can be used for forming the emitter structure 5. The method is described for the formation of an n-type emitter structure 5, wherein the emitter structure 5 is for example doped with n-type dopants such as Phosphorus or Arsenic. However, the method can also be used for forming p-type emitter structures, wherein the emitter structure 5 is for example doped with p-type dopants, e.g. using Boron or Aluminum as a dopant.

In one embodiment, a first semiconductor layer of a first dopant type, e.g. a first n-doped silicon layer 20, is formed on a substrate 10 (FIG. 2(a)) for forming a first emitter region 11. When fabricating a photovoltaic device, the substrate 10 may act as a base region 13 or a base region 13 may be provided on the substrate 10 before forming the first emitter region 11. The semiconductor layer of the first dopant type, e.g. the first n-doped silicon layer 20, may be grown epitaxially on the substrate 10, for example by means of Chemical Vapor Deposition (CVD), such as for example atmospheric CVD, reduced pressure CVD, low pressure CVD or plasma enhanced CVD. The CVD growth can be done for example from a precursors such as for example silane (SiH4) or any of the chlorosilanes (e.g. trichlorosilane (TCS) or dichlorosilane (DCS)) as a silicon source, in combination with an n-type dopant source (e.g. Arsine (AsH3) or Phosphine (PH3)). The temperature at which the CVD growth is performed depends on the silicon source used; it can for example be in the range between 700° C. (with silane as a silicon source) and 1175° C. (with TCS as a silicon source).

Figure 7A:
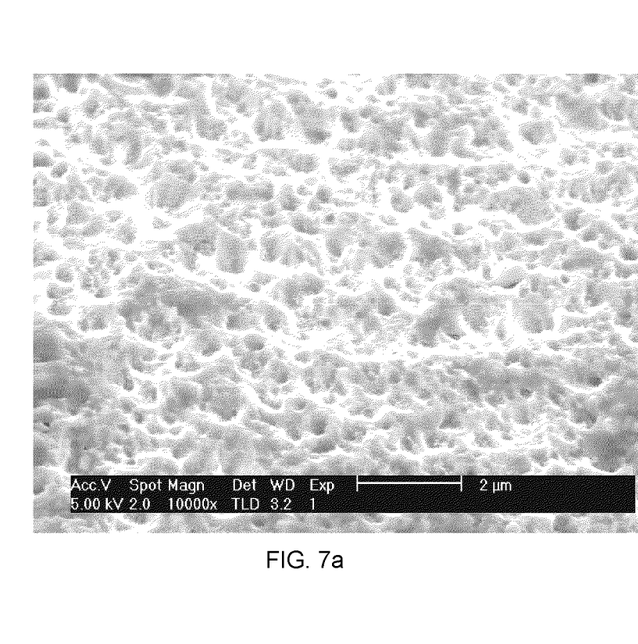
FIG. 7a shows a SEM picture of the textured surface of the first emitter region.

After forming the first semiconductor layer of the first dopant type, e.g. the first n-doped silicon layer 20, the surface of this layer, e.g. the surface of the first n-doped silicon layer 20 may be textured, thereby forming a first emitter region 11 and a first textured surface 21 (FIG. 2(b)). Texturing of the surface may performed to reduce reflection of incident light and thus to enhance the short-circuit current (Jsc) of a photovoltaic device. It is a light trapping method enhancing the optical thickness of the active layer of a photovoltaic device. Although in the drawings the textured surface is represented as a surface comprising pyramid-like shapes, other surface textures are possible (e.g. as shown in FIG. 7(a)), depending on the method used for texturing the surface. The texturing may lead to regular or irregular shapes at the surface of the first semiconductor layer. The texturing may be performed by any suitable semiconductor removal method, such as for example etching, e.g. wet or dry etching. The texturing process removes part of the previously grown first silicon layer 20. In embodiments of the present invention, the texturing process does not remove any material from any underlying layer, i.e. the amount of material that is removed by the texturing process may be such that at least part of the first silicon layer 20 remains at the whole first textured surface 21 where an emitter structure 5 is to be formed, such that a first emitter region 11 is obtained at the whole surface where an emitter structure 5 is to be formed. Since epitaxial growth is an expensive process, the semiconductor material removal, e.g. silicon removal, during the texturing process may be limited (e.g. 0.5 µm to 2.5 µm semiconductor material removal). In addition, the texturing process may be a process that is reliable and reproducible on smooth epitaxial surfaces. Ideally, the textured surface is a Lambertian refractor.

Plasma etching based on halogen chemistry (fluorine or chlorine plasma texturing) can for example be used to achieve these objectives. By using this technique surface reflection in the range between about 10% and 15% (30-35% before texturing) has been achieved with a very limited removal of semiconductor material (0.5 to 2 µm removal). The plasma texturing brings many advantages on the level of a photovoltaic cell as compared to non-textured devices, such as for instance a lower reflection, oblique light coupling and a lower contact resistance (because of the higher contact area between semiconductor material and metal). The improvement in short-circuit current can be quantified in the range between about 1.0 and 1.5 mA/cm2.

Apart from plasma etching, other texturing techniques can be used, such as e.g. wet chemical etching (for instance acid etching based on solutions comprising hydrofluoric acid (HF) and/or nitric acid (HNO3) and optionally further comprising acetic acid (CH3COOH) and/or water, or alkaline etching based on solutions comprising potassium hydroxide (KOH) and water or sodium hydroxide (NaOH) and water), possibly in combination with a lithographic mask. Furthermore, additives may be used such as for instance isopropylalcohol for the alkaline etching. However, in general more semiconductor material, e.g. silicon, is removed with these etching methods as compared to plasma etching.

After texturing the surface of the first emitter region 11, a second emitter region 12 is formed at the first textured surface 21 by creating a thin layer of semiconductor material with a high doping concentration at the first textured surface 21. The doping of the second layer of semiconductor material may be with dopants of the first dopant type, e.g. n-type. In one embodiment of the present invention the second emitter region 12 may be formed on top of the first emitter region 11, for example by means of deposition of semiconductor material, e.g. by Chemical Vapor Deposition, as illustrated in FIG. 2(c). The doping may be performed in-situ during deposition of the second layer of semiconductor material. Alternatively, the doping may be performed after the second layer of semiconductor material has been provided. In another embodiment of the present invention, the second emitter region 12 may be formed in the upper part of the first emitter region 11, for example by means of diffusion of a dopant, e.g. of the first dopant type, for example n-type, as illustrated in FIG. 2(d). The upper part of the first emitter region 11 is the part of the first emitter region 11 adjacent to the first textured surface 21. After formation of the second emitter region 12, a second textured surface 22 is obtained at the front surface. The interface between the first emitter region 11 and the second emitter region 12 is a textured interface 14. In embodiments of the present invention wherein the second emitter region 12 is formed in the upper part of the first emitter region 11, the second textured surface 22 coincides with the first textured surface 21.

Forming the first emitter region 11 may comprise forming a first emitter stack comprising at least one first emitter layer. The first emitter stack can comprise or consist of a single first emitter layer.

The first emitter region 11 (or the first emitter stack comprising at least one first emitter layer) may have a total average thickness in the range between about 0.2 µm and 10 µm or between about 0.2 µm and 7 µm or between about 0.2 µm and 4 µm. The doping concentration of the first emitter region 11 may be in the range between about $10^{15}$ cm$^{-3}$ and $10^{19}$ cm$^{-3}$. In case the first emitter stack comprises or consists of a single first emitter layer, a doping profile can be provided in the single first emitter layer with a gradually increasing doping concentration in a direction substantially perpendicular to a surface of the substrate 10 and in a direction from the back surface towards the front surface of the substrate 10. In embodiments of the present invention, the lowest doping concentration of the gradually increasing doping concentration may be at least about $10^{15}$ cm$^{-3}$, and the highest doping concentration may be not higher than about $10^{19}$ cm$^{-3}$, i.e. the doping concentration of the doping profile may be in the range between about $10^{15}$ cm$^{-3}$ and $10^{19}$ cm$^{-3}$. In case the first emitter stack comprises or consists of more than one first emitter layer, a gradually increasing doping concentration can be provided in the different layers of the first emitter stack in a direction substantially perpendicular to the surface of the substrate 10 and in a direction from the back surface towards the front surface of the substrate 10 The doping concentration in each layer can be constant or can gradually increase in a direction substantially perpendicular to the surface of the substrate 10 and in direction from the back surface towards the front surface of the substrate 10. In embodiments of the present invention, the lowest doping concentration of a layer in the emitter stack may be at least about $10^{15}$ cm$^{-3}$ and the highest doping concentration of a layer in the emitter stack may be not higher than about $10^{19}$ cm$^{-3}$, i.e. the doping concentration of the layers in the stack may be in the range between about $10^{15}$ cm$^{-3}$ and $10^{19}$ cm$^{-3}$.

In accordance with embodiments of the present invention, forming the second emitter region 12 at the first textured surface 21 comprises forming the second emitter region 12 on top of the first textured surface 21, by any suitable method, for example by means of CVD growth. Forming the second emitter region 12 can comprise forming a second emitter stack comprising at least one second emitter layer. The second emitter stack can comprise or consist of a single second emitter layer.

In embodiments of the present invention, the second emitter region formed on top of the first textured surface 21 may have a total average thickness larger than about 5 nm and smaller than about 250 nm, or smaller than 200 nm, or smaller than 150 nm, or smaller than 100 nm, or smaller than 50 nm, or smaller than 40 nm, or smaller than 25 nm. The second emitter region 12 may have a thickness smaller than the thickness of the first emitter region 11. The second emitter region 12 (or the second emitter stack comprising at least one second emitter layer) may have a doping concentration that is substantially higher than the doping concentration of the first emitter region 11. Advantageously the doping concentrations at the interface 14 between the first emitter region 11 and the second emitter region 12 differ by at least one order of magnitude, i.e. by at least a factor of about 10. In particular embodiments, the doping concentrations differ by a factor of about 100. In particular embodiments, the doping concentrations differ by a factor of about 1000, 10000 or 100000. The doping concentration of the second emitter region 12 formed on top of the first textured surface 21 may be in the range between about $5 \times 10^{18}$ cm$^{-3}$ and $5 \times 10^{21}$ cm$^{-3}$.

The second emitter region 12 or the second emitter stack comprising at least one second emitter layer can for instance be formed by means of any suitable semiconductor material deposition technique, such as for example CVD, e-beam evaporation or sputter techniques. An advantage of using CVD is the high material quality that can be obtained. The quality of the deposited epitaxial layer can be determined by counting the amount of defects per unit area after a defect etch such as for example Secco etch or Schimmel etch. Defects in an epitaxial layer may act as a leakage source and lead to a reduction of the open-circuit voltage of a photovoltaic device. An additional advantage of using CVD for forming the second emitter region 12 is that the active doping (such as e.g. arsenic or boron) concentration can be very high (up to $10^{21}$ cm$^{-3}$). Because the second emitter region 12 is relatively thin, also other (for instance cheaper) methods for forming this layer can be used, such as for example sputtering. The difference in doping concentration between the first emitter region 11 and the second emitter region 12 at the interface 14 between both emitter regions can be large and a sharp transition (i.e. a process in the doping concentration) can be obtained at the interface 14 between both regions, such that a Front surface field is formed. The Front surface field is a local electric field, in one embodiment formed inside the emitter structure, more in particular between the first emitter region 11 and the second emitter region 12. This electric field reduces the probability that minority carriers in the emitter structure move towards the front surface 22 of the device. Therefore the Front surface field has a surface passivation effect. The higher the difference in doping concentration between the first emitter region 11 and the second emitter region 12, the stronger the electric field and the better the passivation effect may be.

The doping concentration of the second emitter region 12 formed on top of the first textured surface 21 may be between about $5 \times 10^{18}$ cm$^{-3}$ and $5 \times 10^{21}$ cm$^{-3}$. In case the second emitter stack comprises or consists of a single second emitter layer, a gradually increasing doping concentration can be provided in a direction substantially perpendicular to the plane of the first emitter region 11 and in a direction from the first emitter region 11 to the second textured surface 22. Doping can for example be done by changing the gas flow of the doping gas, and therefore the gradient in doping concentration is perpendicular to the textured surface.

In case the second emitter stack comprises more than one second emitter layer, a gradually increasing doping concentration can be provided in the different second emitter layers of the second emitter stack (by methods described above) in a direction substantially perpendicular to the plane of the first emitter region 11 and in a direction from the first emitter region 11 to the second textured surface 22. The doping concentration of each second emitter layer can be constant or it can gradually increase in a direction substantially perpendicular to the plane of the first emitter region 11 and in a direction from the first emitter region 11 to the second emitter region 12.

In case the second emitter region 12 is formed by means of CVD, a gradually increasing doping concentration in a layer can for example be obtained by continuously increasing the flow of the doping gas during formation of the layer.

For forming the first emitter region 11, in case it is a silicon-comprising semiconductor layer, as a silicon precursor, trichlorosilane (TCS), dichlorosilane (DCS) or silane can for example be used at growth temperatures ranging from 700° C. to 1150° C. As a doping gas, for example Arsine or Phosphine can be used. For forming the second emitter region 12 the growth temperature may be lower than for the first emitter region 11. This allows reaching very high doping concentrations and it allows a good control of the process of growing a very thin layer (because of the low growth rate at low temperatures). For example, the second emitter region may be grown at about 700° C. with DCS as a precursor in combination with a high flow (e.g. up to 800 sccm) of doping elements, e.g. Arsine.

In accordance with some embodiments of the present invention, forming the second emitter region 12 at the first textured surface 21 comprises forming the second emitter region 12 in an upper part of the first emitter region 11, i.e. in part of the first emitter region 11 adjacent to the first textured surface 21. This can for example be done by means of a diffusion process whereby a dopant is diffused into the upper part of the first emitter region 11, by any suitable means, e.g. by means of an implantation process or by means of a laser doping process.

In these embodiments of the present invention, the second emitter region 12 formed in an upper part of the first emitter region 11 may have a doping concentration that is substantially higher than the doping concentration of the remainder of the first emitter region 11, i.e. in the lower part of the first emitter region 11 where no second emitter region 12 is formed. In particular embodiments, the doping concentrations at the interface 14 differ by at least one order of magnitude, i.e. by at least a factor of about 10. In particular embodiments, the doping concentrations differ by a factor of about 100. In particular embodiments, the doping concentrations differ by a factor of about 1000, 10000 or 100000.

The interface between the second emitter region 12 formed in an upper part of the first emitter region 11 and the remainder of the first emitter region 11 is a textured or substantially textured interface 14. Depending on the process used for forming the second emitter region 12, e.g. a diffusion process, implantation process or laser doping process, the texture of the textured interface 14 between the first emitter region 11 and the second emitter region 12 may be less pronounced or more pronounced, but in accordance with embodiments of the present invention it always is a textured surface.

The texture of the interface 14 can correspond to the texture present at the second textured surface or front surface 22. The interface 14 between the second emitter region 12 created in the upper part of the first emitter region 11 and the remainder of the first emitter region can thus be made substantially parallel with the second textured surface or front surface 22. In other words, the interface 14 between the second emitter region 12 and the first emitter region 11 may substantially follow the texture profile present at the front surface 22. In still other words, the interface 14 between the second emitter region 12 created in an upper part of the first emitter region 11 and the remainder of the first emitter region can be produced at a constant distance or depth (indicated with d in FIG. 1) below the textured front surface 22. The spread on this depth d can be for instance smaller than about 50%, or smaller than 40%, or smaller than 30%, or smaller than 20%, or smaller than 10%.

In embodiments of the present invention where forming the second emitter region 12 at the first textured surface 21 comprises forming the second emitter region 12 in an upper part of the first emitter region 11, the second emitter region 12 created in the upper part of the first emitter region 11 may have a total average thickness in the range between about 5 nm and 1 μm or between about 5 nm and 500 nm or between about 5 nm and 250 nm, and a doping concentration in the range between about $5 \times 10^{18}$ cm$^{-3}$ and $10^{22}$ cm$^{-3}$.

In such embodiments in which a diffused second emitter region 12 is provided in the first emitter region 11, the total doping concentration in the second emitter region 12 can be higher than in embodiments in which the second emitter region 21 is formed on top of the first emitter region 11, for example by means of CVD.

In embodiments in which a second emitter region 12 is provided in an upper part of the first emitter region 11, the transition in doping concentration between the second emitter region 12 and the first emitter region 11 at the interface 14 may not be as sharp as in embodiments wherein the second emitter region 12 is formed on top of the first emitter region 11. Therefore the strength of the local electric field of Front surface field may be weaker in case of second emitter regions 12 provided in an upper part of the first emitter region 11 as compared to the case of second emitter regions 12 formed on top of the first emitter region 11. In embodiments where the second emitter region 12 is a region formed in an upper part of the first emitter region 11, implantation can be used to create a thin highly doped second emitter region 12 in an upper part of the first emitter region 11. The active doping concentration obtained with implantation can be very high, but the doping profile can be controlled less accurately than in the case of diffusion.

In embodiments of the present invention, before forming the first emitter region 11, an undoped or non-intentionally doped layer 30, e.g. a semiconductor layer such as a silicon layer, can be provided, on which the first emitter region 11 is formed. The thickness of such an undoped or non-intentionally doped layer 30 may be between about 0 and 1000 nm or between 0 and 500 nm or between 0 and 300 nm, or between 0 and 250 nm, or between 0 and 100 nm. The presence of such an undoped or non-intentionally doped layer 30 may result in an increase in short-circuit current of a photovoltaic cell. The undoped or non-intentionally doped layer 30 can be deposited, for example it can be formed by means of chemical vapor deposition (CVD), such as for instance atmospheric CVD, reduced pressure CVD, low pressure CVD or plasma enhanced CVD.

An emitter structure 5 according to embodiments of the present invention, comprising a first emitter region 11 and a second emitter region 12 with a textured interface 14 between the first emitter region 11 and the second emitter region 12 may advantageously be used in a photovoltaic device.

A third aspect relates to a photovoltaic device 6 comprising an emitter structure 5 according to embodiments of the present invention, and to a method for fabricating such a photovoltaic device 6. Characteristics of the device 6, which result from the description of the method aspects, are therefore meant to be included in the description of the third aspect.

In one embodiment, a photovoltaic device 6 comprises an emitter structure 5 according to embodiments of the present invention. It can further comprise a base region 13 and/or a substrate 10. The base region 13 can comprise for example a monocrystalline or a polycrystalline semiconductor layer, e.g. silicon layer, on top of a substrate 10 such as for example a ceramic substrate, glass substrate or semiconductor, e.g. silicon, substrate 10. The purity level of the semiconductor substrate 10 may vary; e.g. in case of a silicon substrate 10 it may range from Metallurgical Grade silicon (MG-Si) up to Electronic Grade silicon (EG-Si) and all purity levels in between (e.g. offspec silicon material, i.e. multicrystalline material with specifications that are out of range for use in a current industrial line for photovoltaics production, or upgraded MG-Si). The substrate 10 can also be a bulk wafer such as for instance a silicon wafer (e.g. Cz-monocrystalline wafer, Fz-monocrystalline wafer or multicrystalline wafer) or any kind of ribbon material (for instance but not only Edge-defined Film-fed Growth (EFG) ribbons, Ribbon Growth on Substrate (RGS) ribbons, String Ribbons, Ribbon on Sacrificial Carbon Template (RST) ribbons).

Figure 3:
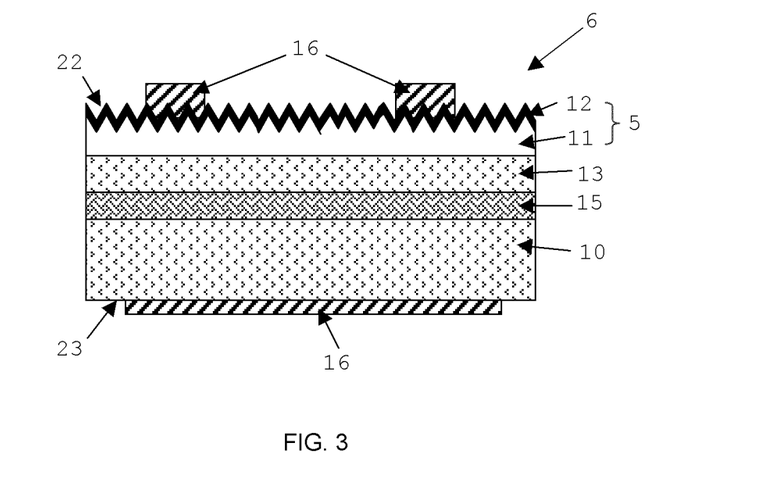
FIG. 3 shows a cross-section of an epitaxial photovoltaic cell with an emitter structure according to embodiments of the present invention.

A photovoltaic device 6 according to the third aspect of the present invention may be an epitaxial cell (as illustrated in FIG. 3), wherein both the bulk region 13 and the first emitter region 11 are grown epitaxially on a substrate 10 (such as for example a ribbon substrate, ceramic substrate, highly doped semiconductor, e.g. silicon, (mono or multi or low-cost multi) substrate). In this case the substrate 10 is not an active part of the photovoltaic device and only serves as a mechanical support for the epitaxial layers. The epitaxial layers may for example comprise a BSF (Back Surface Filed) layer 15, a base region 13 and an emitter region 11,12. For epitaxial cells, the pn-junction is formed at the interface between the epitaxially grown base region 13 and the epitaxially grown first emitter region 11. Metal contacts 16 can be provided both at the front surface 22 and at the back surface 23 of the photovoltaic device 6.

Figure 4:
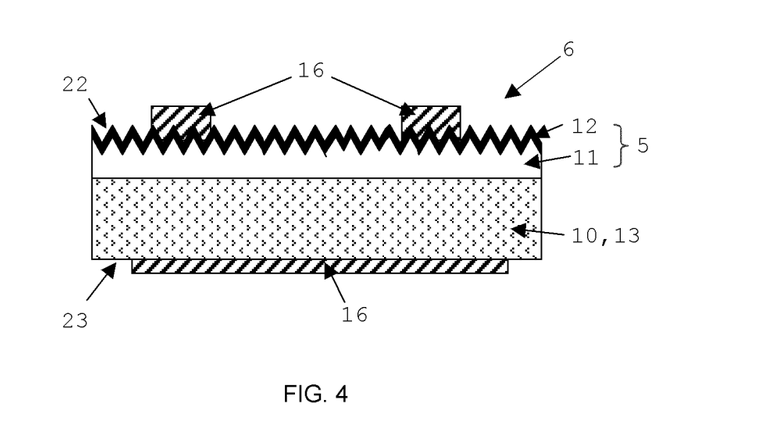
FIG. 4 shows a cross-section of a photovoltaic cell with a bulk substrate and an emitter structure according to embodiments of the present invention, directly formed on top of the bulk substrate.

A photovoltaic device 6 according to embodiments of the present invention may be a bulk photovoltaic cell (as illustrated in FIG. 4), wherein the substrate 10 is an active part of the photovoltaic device. More in particular, the substrate 10 forms the base region 13 of the photovoltaic device 6. In this case only the emitter region is grown epitaxially (on the base region 13). The PN junction is then formed at the interface between the substrate 10 (base region 13) and the epitaxially grown first emitter region 11.

A method for fabricating a photovoltaic device 6 according to embodiments of the present invention comprises forming, on the base region 13, an emitter structure 5 according to embodiments of the present invention. After forming an emitter structure 5 according to embodiments of the present invention, passivation of the front surface 22 can be performed (not illustrated in the drawings), such as for example with a passivation layer or a stack of layers. Such a passivation layer or stack of layers may comprise a dielectric layer or a stack of dielectric layers. Such layers can for example comprise silicon oxide, e.g. formed by means of thermal oxidation or plasma enhanced CVD (PECVD), silicon nitride, e.g. formed by means of Plasma Enhanced CVD (PECVD) or Low Pressure CVD (LPCVD) or Titanium oxide (TiO2), e.g. formed by means of Atmospheric Pressure CVD (APVCD). The application of a passivation layer or a stack of layers for passivating the front surface of the photovoltaic cell 6 can improve the photovoltaic cell performance.

After passivation, an antireflection coating comprising a single layer or a stack of layers can be applied (not illustrated in the drawings), such as for example an antireflection coating comprising or consisting of ZnS and/or MgF2 or silicon nitride (SiNx) in combination with MgF2. However, other materials known by a person skilled in the art may also be used for forming an antireflection coating.

The method for fabricating a photovoltaic device 6 according to embodiments of the present invention may further comprise a contact formation process, i.e. a process for forming metal contacts 16 at the front surface 22 and/or at the back surface 23 of the device. In particular embodiments, metal contacts 16 may be formed by means of screen printing, dispensing, inkjet printing, plating, evaporation or any combination of these techniques. Alternatively, e.g. at lab-scale, evaporated contacts (e.g. formed by electron beam evaporation) can be used, for example comprising or consisting of a Titanium/Palladium/Silver stack (e.g. about 50 nm/70 nm/2000 nm) in combination with plating (electro plating or electroless plating) to thicken the silver layer. However, other methods and materials known by a person skilled in the art may be used.

Figure 5:
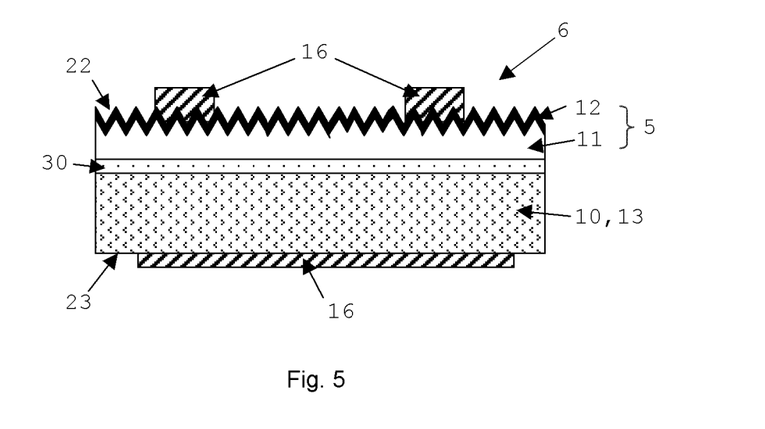
FIG. 5 illustrates an embodiment of the present invention wherein an undoped or non-intentionally doped layer is provided in between the base region and the emitter structure.

In embodiments according to the third aspect of the present invention, the photovoltaic device 6 may further comprise an undoped layer or non-intentionally doped layer 30 between the first emitter region 11 and the base region 13, as illustrated in FIG. 5. The thickness of such an undoped or non-intentionally doped layer 30 may be in the range between about 0 nm and 1000 nm or between 0 nm and 500 nm or between 0 nm and 300 nm, or between 0 nm and 250 nm, or between 0 nm and 100 nm. The undoped or non-intentionally doped layer 30 can for example comprise or consist of semiconductor material, such as e.g. silicon. The presence of such an undoped or non-intentionally doped layer 30 has shown to be beneficial for the resulting photovoltaic cell performance.

Table 1 shows experimental results illustrating the effect of an undoped or non-intentionally doped layer 30 between the base region 13 and the emitter region 11 on the performance of photovoltaic cells 6. The first group of photovoltaic cells (label SC_i) has a standard stack comprising a p-type base layer 13/n+-type first emitter region 11/n++-type second emitter region 12, without intermediate undoped layer 30. The second group of photovoltaic cells (label SC_undop_i) has an undoped or non-intentionally doped layer 30 with a thickness of 400 nm between the base region 13 and the emitter stack 11, 12. The photovoltaic cells 6 listed in table 1 are not textured. From the results it can be concluded that the presence of an undoped or non-intentionally doped layer 30 between the base region 13 and the emitter structure 5 leads to an increase in short-circuit current (Jsc) and an increase in fill factor (FF), leading to an increase in conversion efficiency.

TABLE 1

| Cell Id | $J_{sc}$ [mAcm$^{-2}$] | $V_{oc}$ [mV] | FF [%] | efficiency [%] |
|---|---|---|---|---|
| SC_1 | 30.1 | 626 | 77 | 14.4 |
| SC_2 | 29.7 | 628 | 76 | 14.2 |
| SC_3 | 29.8 | 628 | 77 | 14.5 |
| SC_undop_1 | 29.9 | 630 | 78 | 14.7 |
| SC_undop_2 | 30.8 | 628 | 77 | 14.9 |
| SC_undop_3 | 30.3 | 629 | 77 | 14.7 |

For comparison reasons, experiments have been performed to illustrate texturing before forming the heavily doped second emitter region. Plasma texturing experiments were performed, wherein texturing was performed only after formation of the second emitter region 12 (which is different from embodiments of the present invention, wherein texturing is done before formation of the second emitter region 12). A second emitter region 12 with an average thickness of about 500 nm was provided and plasma textured. It was found that in average about 450 nm of semiconductor material, e.g. silicon, was removed by the texturing process, thus leaving a highly doped second emitter layer with an average thickness of about 50 nm. However, the effectiveness of the texturing process is very limited when only 450 nm of semiconductor material, e.g. silicon, is removed, i.e. the reduction of the reflection of light at the textured surface is insufficient to substantially influence the short-circuit current of a photovoltaic device 6. Furthermore, it is difficult to control this texturing process with an accuracy of a few tens of nm. As a result, too much heavily doped material of the second emitter region 12 may remain at some locations, which may lead to high Auger-losses and, in combination with the poor texturing of the front surface, to low $J_{sc}$ (short-circuit current) values of photovoltaic devices. At other locations "holes" may be created in the second emitter region 12 (as for example illustrated in FIG. 6 left figure). These holes destroy partially the FSF (Front surface field) and lead to lower $V_{oc}$ (open circuit voltage) values.

Table 2 shows results obtained with such texturing approach (i.e. texturing after formation of the second emitter region 12). For the first three samples shown in Table 2, a first emitter region 11 and a second emitter region 12 were formed and the second emitter region 12 was partially etched during texturing. The three last samples have only a first emitter region 11 which was textured for a longer time than the first three samples. As can be concluded from the results shown in Table 2 the short-circuit current $J_{sc}$ of the first samples is lower than the short-circuit current obtained for the samples with only a first emitter region. The lower short-circuit current of the samples wherein texturing was performed after formation of the second emitter region 12 is probably mainly due to Auger recombination in the remaining highly doped second emitter region 12, which can still be rather thick at some locations.

TABLE 2

| Thickness second emitter region [nm]/ thickness first emitter region [nm] | Texturing time [s] | Silicon removed [nm] | $J_{sc}$ [mA/cm$^2$] | $V_{oc}$ [mV] | FF [%] | Efficiency [%] |
|---|---|---|---|---|---|---|
| 550/2000 | 30 | 310 | 16.2 | 596 | 64 | 6.2 |
| 550/2000 | 35 | 430 | 15.9 | 599 | 67 | 6.4 |
| 750/2000 | 30 | 275 | 15.7 | 593 | 67 | 6.2 |

TABLE 2-continued

| Thickness second emitter region [nm]/ thickness first emitter region [nm] | Texturing time [s] | Silicon removed [nm] | $J_{sc}$ [mA/cm$^2$] | $V_{oc}$ [mV] | FF [%] | Efficiency [%] |
|---|---|---|---|---|---|---|
| 0/3000 | 75 | 1270 | 17.7 | 600 | 66 | 7.0 |
| 0/3000 | 85 | 1650 | 18.8 | 612 | 72 | 8.3 |
| 0/3000 | 85 | 1400 | 18.1 | 606 | 66 | 7.3 |

Figure 6:
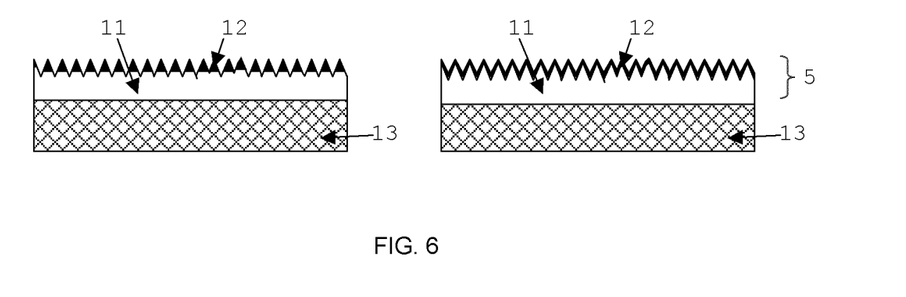
FIG. 6 illustrates the difference between: (left figure) texturing of the complete emitter stack (i.e. after forming the second emitter region); and (right figure) texturing of the first emitter region followed by forming, e.g. growing, the second emitter region in accordance with embodiments of the present invention.

FIG. 6 illustrates the difference between a process wherein the complete emitter stack is textured, i.e. after forming the second emitter region 12 (as illustrated above, this straightforward process is not working well), and a process wherein the first emitter region 11 is textured and wherein the second emitter region 12 is formed after texturing, according to embodiments of the present invention.

Figure 7B:
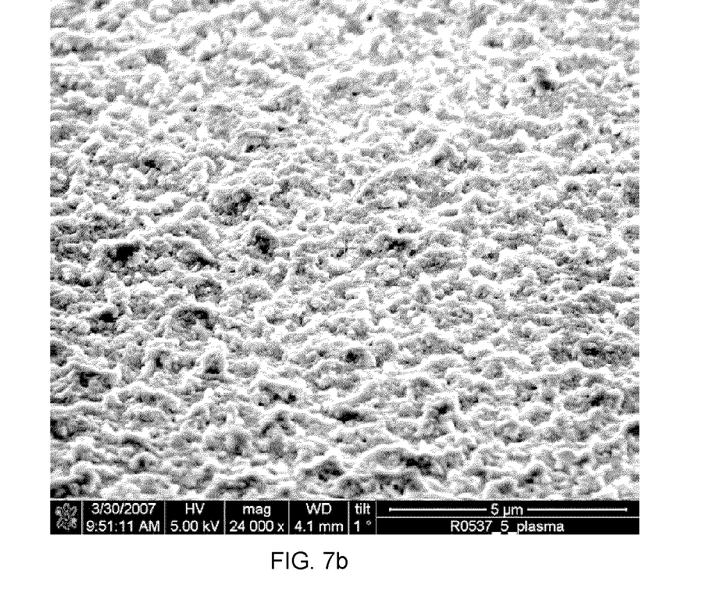
FIG. 7b shows a SEM picture of the front surface after growth of a highly doped second emitter region on top of a textured surface of the first emitter region in accordance with embodiments of the present invention.

To be able to have an excellent FSF in combination with a textured front surface, the growth of the heavily doped second emitter region 12 may be done after texturization of the first emitter region 11. This process sequence according to embodiments of the present invention allows removing for example a pre-determined thickness, e.g. about 1 μm, of semiconductor material, e.g. silicon, from the first emitter region 11 by a suitable texturing method, e.g. plasma etching, resulting in a low light reflection at the front surface, e.g. below 15%. Epitaxial growth on a textured surface may result in low quality, e.g. highly defected layers, as can be seen on the SEM pictures in FIG. 7a and FIG. 7b. Nevertheless, if the thickness of these layers (corresponding to the second emitter region 12) is relatively small, it is possible to compensate the losses in open-circuit voltage (due to the increase in defects) by the increase in short-circuit current (due to the textured surface). Defect etching of layers epitaxially grown on a textured surface revealed a defect density of about $1 \times 10^8$ at/cm$^3$.

In a first set of experiments, photovoltaic cells according to embodiments of the present invention, i.e. with texturing between the first and second emitter region 11; 12 were fabricated with a lab-scale process. Results are shown in Table 3. Open circuit voltages around 635 mV were obtained, these results being comparable to the open circuit voltages obtained for photovoltaic cells without texturing. A good fill factor (around 77%) and short circuit currents up to 23.5 mA/cm$^2$ (without any anti reflective coating) were achieved. This is an absolute increase in current of 4.5 mA/cm$^2$ compared to equivalent photovoltaic cells without texturing between the first and second emitter layers 11, 12.

TABLE 3

| Texturing time [s] | Silicon removed [nm] | $J_{sc}$ [mA/cm$^2$] | $V_{oc}$ [mV] | FF [%] | Eff [%] |
|---|---|---|---|---|---|
| 50 | 850 | 23.3 | 633 | 77 | 11.3 |
| 50 | 850 | 23.5 | 633 | 77 | 11.4 |
| 65 | 1100 | 21.9 | 627 | 77 | 10.6 |
| 65 | 1100 | 22.3 | 628 | 77 | 10.8 |
| 65 | 1100 | 21.9 | 627 | 77 | 10.5 |
| 65 | 1100 | 21.8 | 628 | 77 | 10.6 |
| Average of non-textured cells | | 18.8 | 632 | 78 | 9.3 |

In a second set of experiments, photovoltaic cells according to embodiments of the present invention were made with a screen printing process for contact formation, a typical industrial-scale process. Multicrystalline low-cost offspec material was used as a substrate material. After formation of a 2000 nm thick n-doped first silicon layer 20 with a doping concentration of $5 \times 10^{18}$ cm$^{-3}$, the surface was textured by means of plasma texturing, thereby removing 0.5 to 0.7 μm of silicon and forming the first emitter region 11. After plasma texturing, a highly doped second emitter region 12 was grown with a thickness of 50 nm and with an active Arsenic doping concentration of $4 \times 10^{19}$ cm$^{-3}$. On part of the samples a 17 nm thin oxide layer was formed by a dry oxidation process. A SiN$_x$-deposition process was performed on all samples for forming an antireflection coating. Screen printing was used to contact the samples. The results are shown in Table 4.

TABLE 4

| Condition | $J_{sc}$ [mA/cm$^2$] | $V_{oc}$ [mV] | Eff [%] |
|---|---|---|---|
| No oxide | 19.1-20.3 | 586-607 | 7.5-8.9 |
| Oxide | 21.9-24.1 | 577-609 | 8.9-10.3 |

Figure 8:
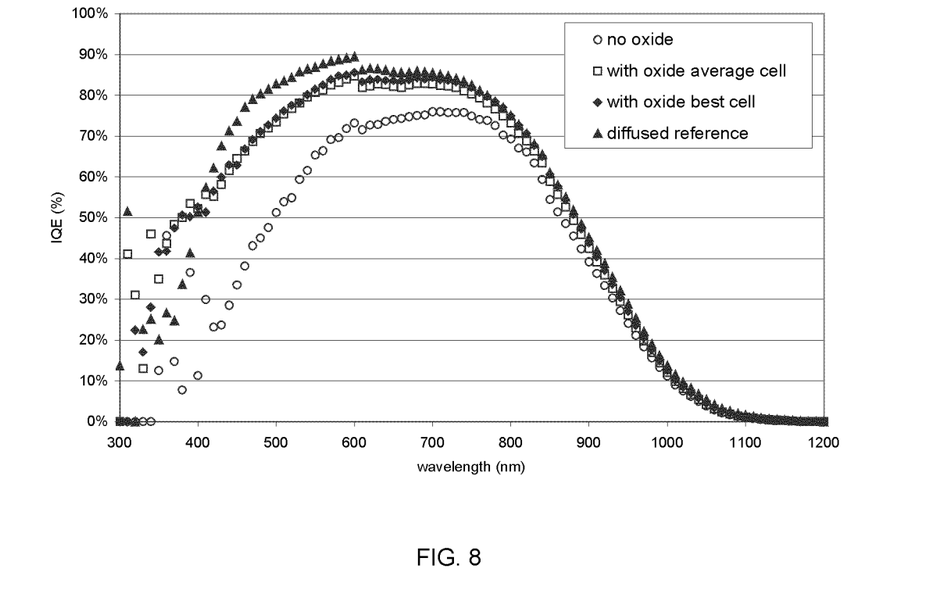
FIG. 8 shows a graph with the IQE (internal quantum efficiency) for different samples.

The effect of the oxidation on the $J_{sc}$ is large as can be seen from table 4. This doesn't translate in a similar effect on the $V_{oc}$. The efficiency is clearly better for the oxidized cells. FIG. 8 shows a graph with the IQE (internal quantum efficiency) for the following samples:
  cell 1, representative for non-oxidized samples
  cell 2, representative for oxidized samples
  cell 3, best oxidized cell
  cell 4, screen printed epi-cell with diffused emitter structure (IQE only)

The effect of the oxidation on the IQE is apparent while it does not negatively impact the reflection. At long wavelengths, all IQEs match. At very short wavelengths (350-400 nm), the IQE of the emitter CVD cells is better than for the diffused cells. It is believed that this is related to the good passivation quality of the oxide.

The foregoing description details certain embodiments of the invention. It will be appreciated, however, that no matter how detailed the foregoing appears in text, the invention may be practiced in many ways. It should be noted that the use of particular terminology when describing certain features or aspects of the invention should not be taken to imply that the terminology is being re-defined herein to be restricted to including any specific characteristics of the features or aspects of the invention with which that terminology is associated.

While the above detailed description has shown, described, and pointed out novel features of the invention as applied to various embodiments, it will be understood that various omissions, substitutions, and changes in the form and details of the device or process illustrated may be made by those skilled in the technology without departing from the spirit of the invention. The scope of the invention is indicated by the appended claims rather than by the foregoing description. All changes which come within the meaning and range of equivalency of the claims are to be embraced within their scope.

What is claimed is:

1. A method of forming an emitter structure on a semiconductor substrate, the method comprising:
    forming, on the semiconductor substrate, a first silicon layer doped with a dopant of a first type and having a first surface;
    after forming the first silicon layer, texturing the first surface of the first silicon layer thereby forming a first emitter region from the first silicon layer, the first emitter region comprising a first textured surface; and
    after texturing the first surface, forming a second emitter region comprising a second silicon layer doped with a dopant of the first type over the first textured surface, the second emitter region having a second textured surface.

2. The method according to claim 1, wherein the process of forming the first silicon layer comprises epitaxially growing the first silicon layer on a surface of the substrate.

3. The method according to claim 1, wherein the process of texturing the first surface of the first silicon layer comprises plasma etching the first silicon layer.

4. The method according to claim 1, wherein the process of forming the second emitter region comprises growing the second emitter region on the first textured surface.

5. The method according to claim 4, wherein the process of growing the second emitter region comprises epitaxially growing the second emitter region.

6. The method according to claim 1, wherein the process of forming the second emitter region comprises forming the second emitter region in contact with the first textured surface of the first emitter region.

7. The method according to claim 6, wherein the process of forming the second emitter region comprises forming the second emitter region by diffusion, implantation or laser doping.

8. The method according to claim 1, wherein the doping concentration of the second emitter region is at least a factor of 10 higher than the doping concentration of the first emitter region.

9. The method according to claim 1, wherein both the first emitter region and the second emitter region extend over substantially the whole surface of the first silicon layer.

10. The method of claim 1, wherein the first silicon layer is formed of crystalline silicon.

* * * * *